(12) United States Patent
Miyakoshi

(10) Patent No.: US 6,172,299 B1
(45) Date of Patent: Jan. 9, 2001

(54) BOX-SHAPED ELECTRIC PART-MOUNTING CONSTRUCTION

(75) Inventor: Koji Miyakoshi, Shizuoka (JP)

(73) Assignee: Yazaki Corporation, Tokyo (JP)

( * ) Notice: Under 35 U.S.C. 154(b), the term of this patent shall be extended for 0 days.

(21) Appl. No.: 09/311,561

(22) Filed: May 14, 1999

(30) Foreign Application Priority Data

May 20, 1998 (JP) .................................. 10-138585

(51) Int. Cl.[7] .............................. H02G 3/08; H05K 5/00
(52) U.S. Cl. ..................... 174/52.1; 361/809; 361/810; 248/213.2
(58) Field of Search ........................... 174/52.1; 361/808, 361/809, 810, 811; 248/213.2

(56) References Cited

U.S. PATENT DOCUMENTS

| | | | |
|---|---|---|---|
| 3,477,679 | * 11/1969 | Lovitz | 248/213.2 |
| 3,952,142 | * 4/1976 | Weiss | 174/52.1 |
| 5,610,368 | * 4/1976 | Smith | 174/35 GC |
| 5,777,263 | * 7/1998 | Maehler et al. | 174/51 |

* cited by examiner

Primary Examiner—Kristine Kincaid
Assistant Examiner—Hung V Ngo
(74) Attorney, Agent, or Firm—Sughrue, Mion, Zinn, Macpeak & Seas, PLLC

(57) ABSTRACT

In a box-shaped electric part-mounting construction, a block (10) is fixedly mounted on a mounting portion such as a vehicle body, and a box-shaped electric part (30a) is mounted on the block through an attachment (20). An upwardly-open notch (14) is formed in a rib (13) formed in an upstanding manner on the block (10). The attachment (20) is reversibly fitted and held in the notch (14). Engagement portions (24) and (25) of different shapes for respectively holding two different box-shaped electric parts (30a) and (30b) are formed respectively on opposite sides of the attachment (20), and the different box-shaped electric parts (30a) and (30b) can be mounted on the block (10) through the attachment (20).

10 Claims, 6 Drawing Sheets

BOX-SHAPED ELECTRIC PART-MOUNTING CONSTRUCTION

BACKGROUND OF THE INVENTION

1. Field of the Invention

The present invention relates to a box-shaped electric part-mounting construction, and more particularly to a box-shaped electric part-mounting construction for detachably supporting a box-shaped electric part on a block through an attachment.

The present application is based on Japanese Patent Application No. Hei. 10-138585, which is incorporated herein by reference.

2. Description of the Related Art

In an automobile or the like, in order to mount box-shaped electric parts (e.g. connectors) in a collected manner at one portion, ribs 2 are formed on a connector block 1 fixedly mounted on a vehicle body or the like, as shown in FIG. 5, and the connectors 4 are retained by lock portions 3 formed on the ribs 2, and a plurality of wire harnesses are connected through these connectors 4.

Unexamined Japanese Patent Publication No. Hei. 7-245489 discloses another box-shaped electric part-mounting construction. As shown in FIGS. 6 and 7, this box-shaped electric part-mounting construction includes an attachment 3, and a box-shaped electric part (corresponding to a connector) 4 is mounted on a bracket 2 through the attachment 3. Engagement portions 3a and a retaining portion 3b for attaching the box-shaped electric part 4 to the attachment 3 are formed on one side of the attachment 3, and engagement portions 3c and a retaining portion 3d (see FIG. 7) for attaching the attachment 3 to the bracket 2 are formed on the other side of the attachment 3. Engagement portions 4a for engagement respectively with the engagement portions 3a of the attachment 3, as well as a retaining portion 4b for engagement with the retaining portion 3b, are formed on a rear or reverse surface of the electric part 4. Engagement portions 2a for engagement respectively with the engagement portions 3c of the attachment 3, as well as a retaining portion 2b for engagement with the retaining portion 3d, are formed on an outer surface of the bracket 2.

The engagement portions 3c of the attachment 3 are engaged respectively with the engagement portions 2a of the bracket 2, and also the retaining portion 3d of the attachment 3 is engaged with the retaining portion 2b of the bracket 2, thereby retaining the attachment 3 on the bracket 2. The engagement portions 4a of the box-shaped electric part 4 are engaged respectively with the engagement portions 3a of the attachment 3, and also the retaining portion 4b of the box-shaped electric part 4 is engaged with the retaining portion 3b of the attachment 3, thereby retaining the box-shaped electric part 4 on the attachment 3.

In the vehicle or the like, the connectors (box-shaped electric parts) 4 are mounted in a collected manner on a mounting member (such as a vehicle body) through the block 1, as shown in FIG. 5. At this time, the connectors 4 to be attached to the block 1 are suitably selected and used in accordance with the specification. Therefore, if each of the connectors 4 is adapted to be attached to the block 1 through the attachment 3 as shown in FIG. 6, and the structure of connection between each attachment 3 and the block 1 has an identical construction, then the selected connectors 4 of several kinds can be attached to the same block 1, and therefore the common block 1 can be used. In this case, however, several kinds of attachments 3, corresponding to the kinds of the connectors 4, must be prepared, and a stock management for the attachments 3 is cumbersome.

SUMMARY OF THE INVENTION

In view of the above, an object of the present invention is to provide a box-shaped electric part-mounting construction in which two kinds of connectors can be attached to one attachment, thereby reducing the number of the attachments so as to reduce the cost and also to facilitate a stock management.

In order to achieve the above object, according to the first aspect of the present invention, there is provided a mounting construction which comprises a block attachable to a mounting portion, a rib formed on the block, a notch formed in the rib, an attachment having a first surface and a second surface opposite to the first surface, the attachment reversibly fittable in the notch, a first engagement portion, to which a first box-shaped electric part is attachable, formed on the first surface of the attachment, and a second engagement portion, to which a second box-shaped electric part is attachable, formed on the second surface of the attachment, a shape of the second engagement portion being different from the first engagement portion. More specifically, the attachment is fittable in the notch reversibly with respect to the first and second surfaces. Further, it is preferable that the rib is formed on the block in an upstanding manner. Furthermore, it is preferable that the notch formed in the rib to open upwardly.

In the construction according to the first aspect of the present invention, the attachment is inserted into the notch from the upper side of the rib, and is attached to the block. At this time, the attachment is mounted in the notch, with the required engagement portion disposed at the box-shaped electric part-mounting surface of the block. Then, the box-shaped electric part is engaged with the engagement portion. When the different box-shaped electric part is to be engaged with the block, the box-shaped electric part-mounting surfaces of the attachment are reversed, and the attachment is mounted in the notch, and then the different box-shaped electric part is engaged with the other engagement portion. Therefore, the two kinds of box-shaped electric parts can be mounted through one attachment, and the number of the attachments can be reduced, and therefore the cost is reduced, and also a stock management is easy.

According to the second aspect of the present invention, the notch may have a U-shaped contour. In this construction, if the attachment is mounted upside down in the notch, the attachment can not be completely inserted into the notch. Therefore, the erroneous mounting can be easily detected.

According to the third aspect of the present invention, the mounting construction may further comprises a groove, and a ridge engageable with the groove, wherein one of the groove and the ridge is formed at that surface of the rib defining the notch while another of the groove and the ridge is formed at an edge of the attachment, and wherein, when the attachment is fitted in the notch, the groove engages with the ridge. In this construction, when inserting the attachment into the notch in the rib, the attachment is guided by the groove or the ridge provided at the rib, and therefore the attachment can be easily mounted in the notch.

According to the fourth aspect of the present invention, the mounting construction may further comprises a recess, and a projection engageable with the groove, wherein one of the recess and the projection is formed at that surface of the rib defining the notch while another of the recess and the projection is formed at an edge of the attachment, and wherein, when the attachment is fitted in the notch, the recess engages with the projection so that the attachment is retained relative to the rib. In this construction, the attachment is retained relative to the rib, and therefore will not be disengaged from the block.

DETAILED DESCRIPTION OF THE PREFERRED EMBODIMENTS

Figure 1:
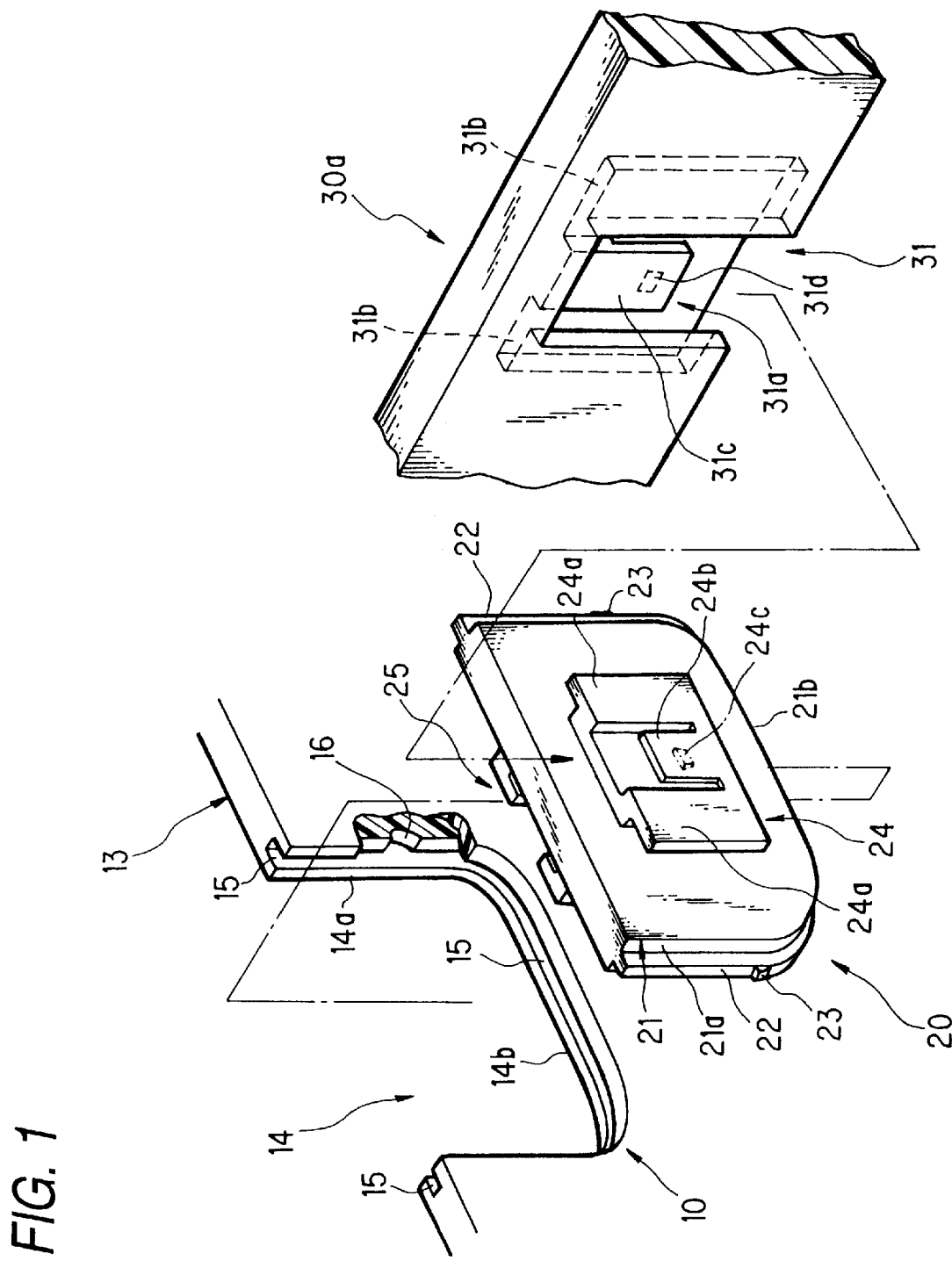
FIG. 1 is an exploded, perspective view of one preferred embodiment of a box-shaped electric part-mounting construction of the present invention, showing the manner of mounting one of two different connectors.
Figure 2A:
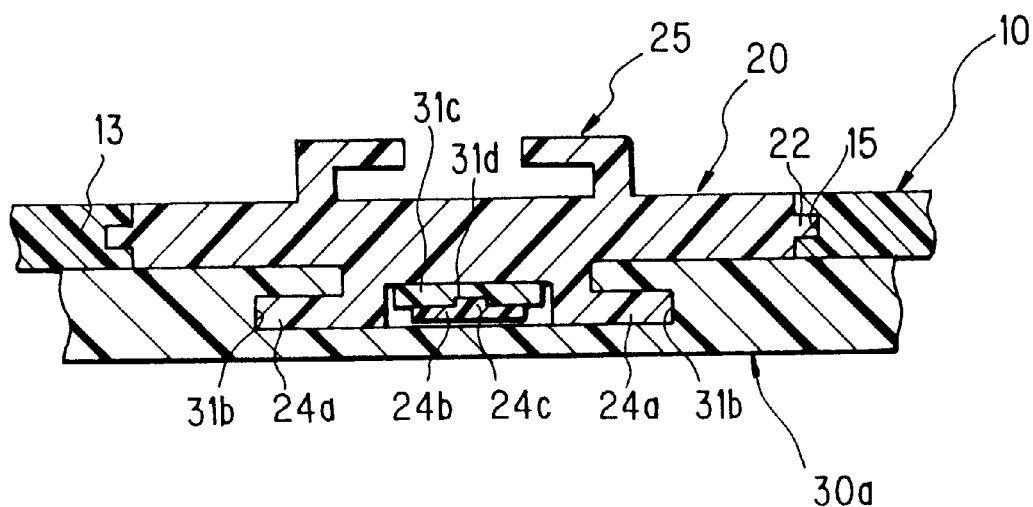
FIGS. 2A and 2B are horizontal and vertical cross-sectional views, respectively, showing a condition in which the connector is mounted on a connector block of FIG. 1 through an attachment.
Figure 2B:
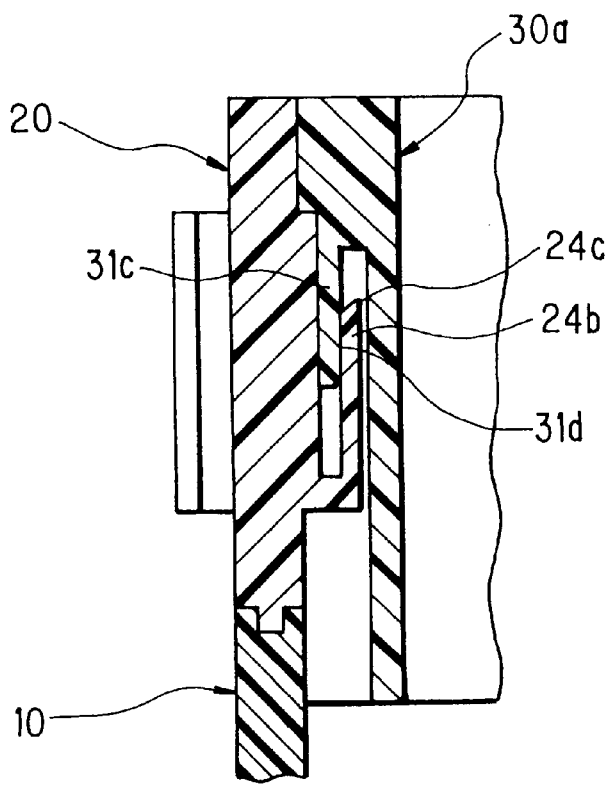
Figure 3:
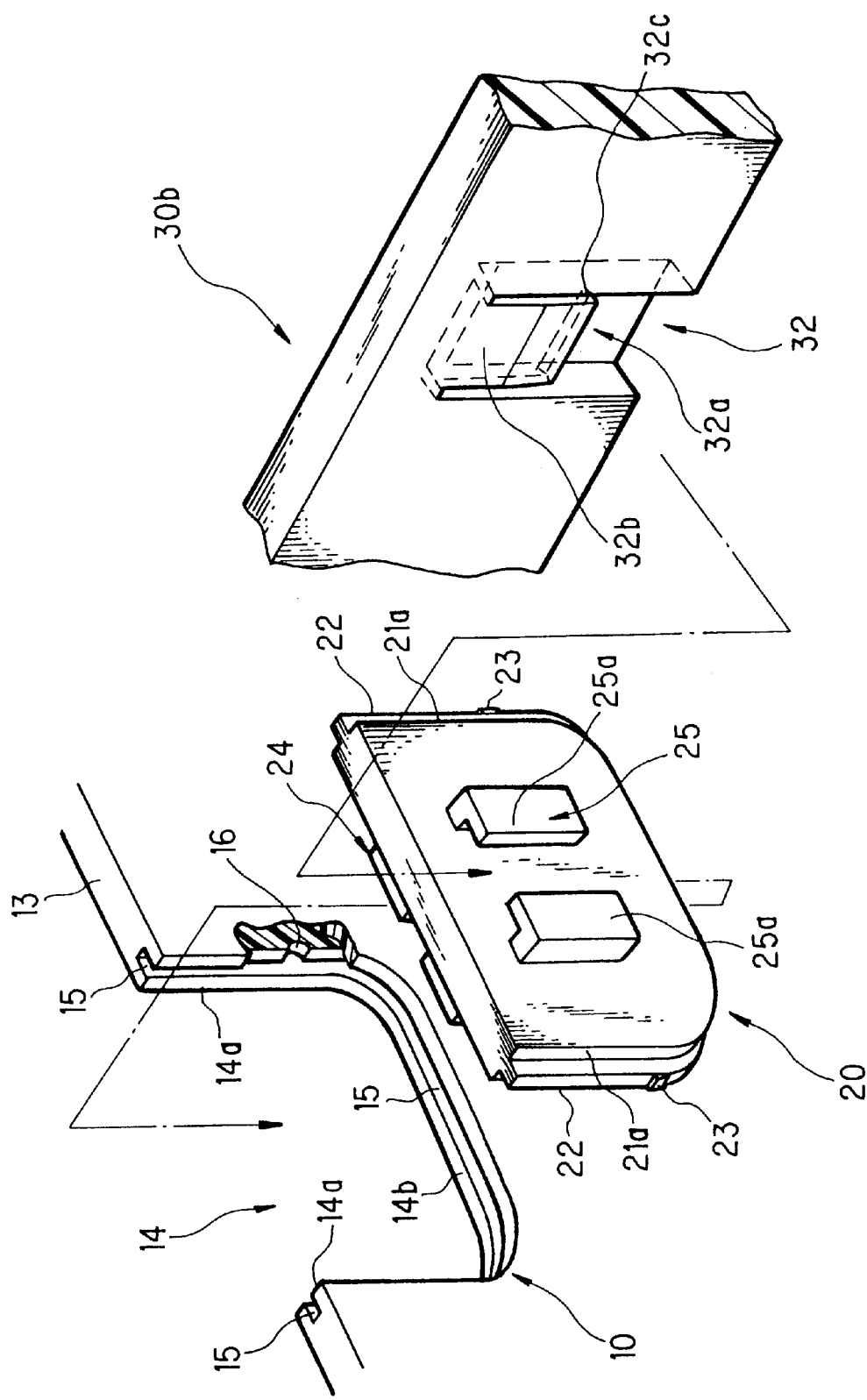
FIG. 3 is an exploded, perspective view of the box-shaped electric part-mounting construction of FIG. 1, showing the manner of mounting the other connector.
Figure 4A:
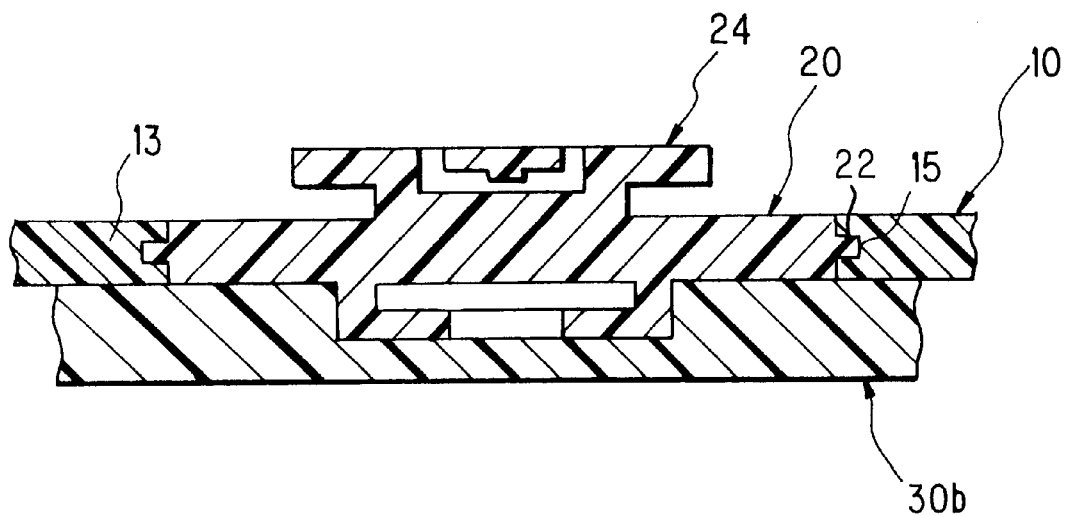
FIGS. 4A and 4B are horizontal and vertical cross-sectional views, respectively, showing a condition in which the connector is mounted on the connector block of FIG. 3 through the attachment.
Figure 4B:
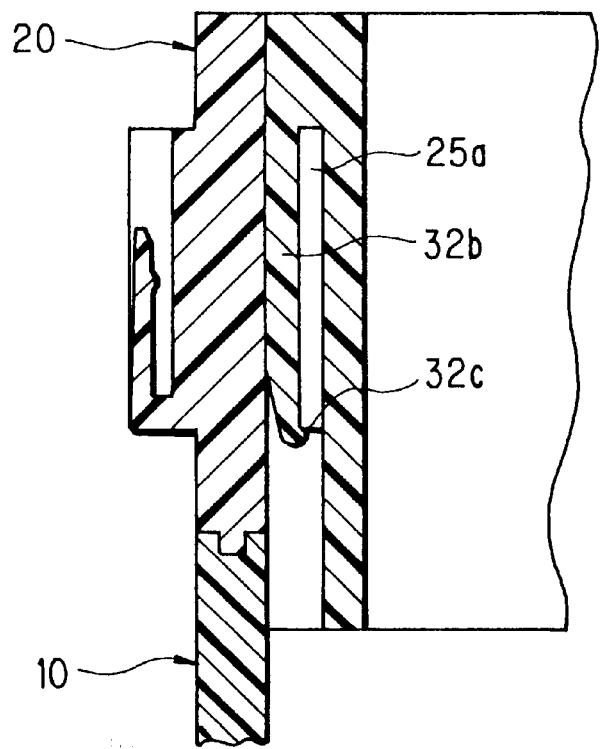
Figure 5:
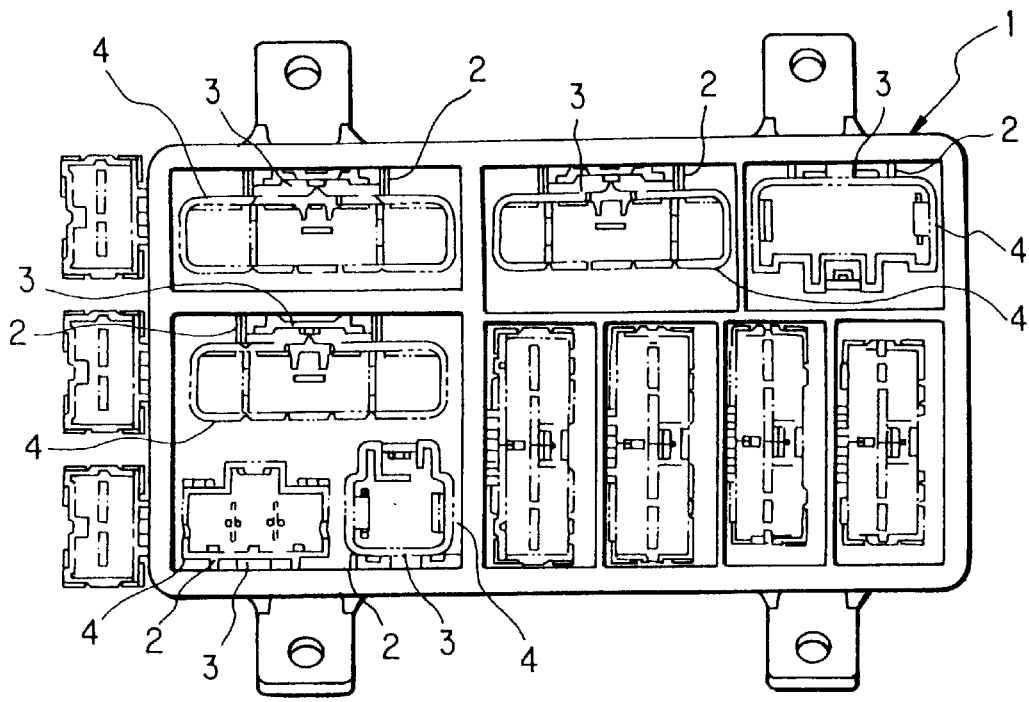
FIG. 5 is a plan view of the connector block using the related box-shaped electric part-mounting construction.
Figure 7:
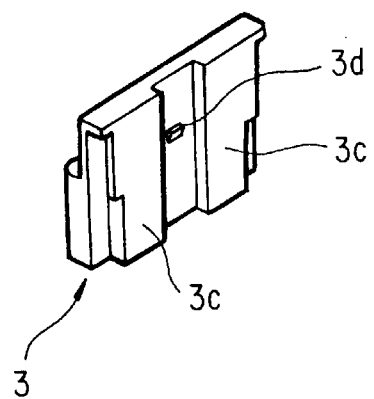
FIG. 7 is a perspective view showing a reverse side of the attachment of FIG. 6.
Figure 6:
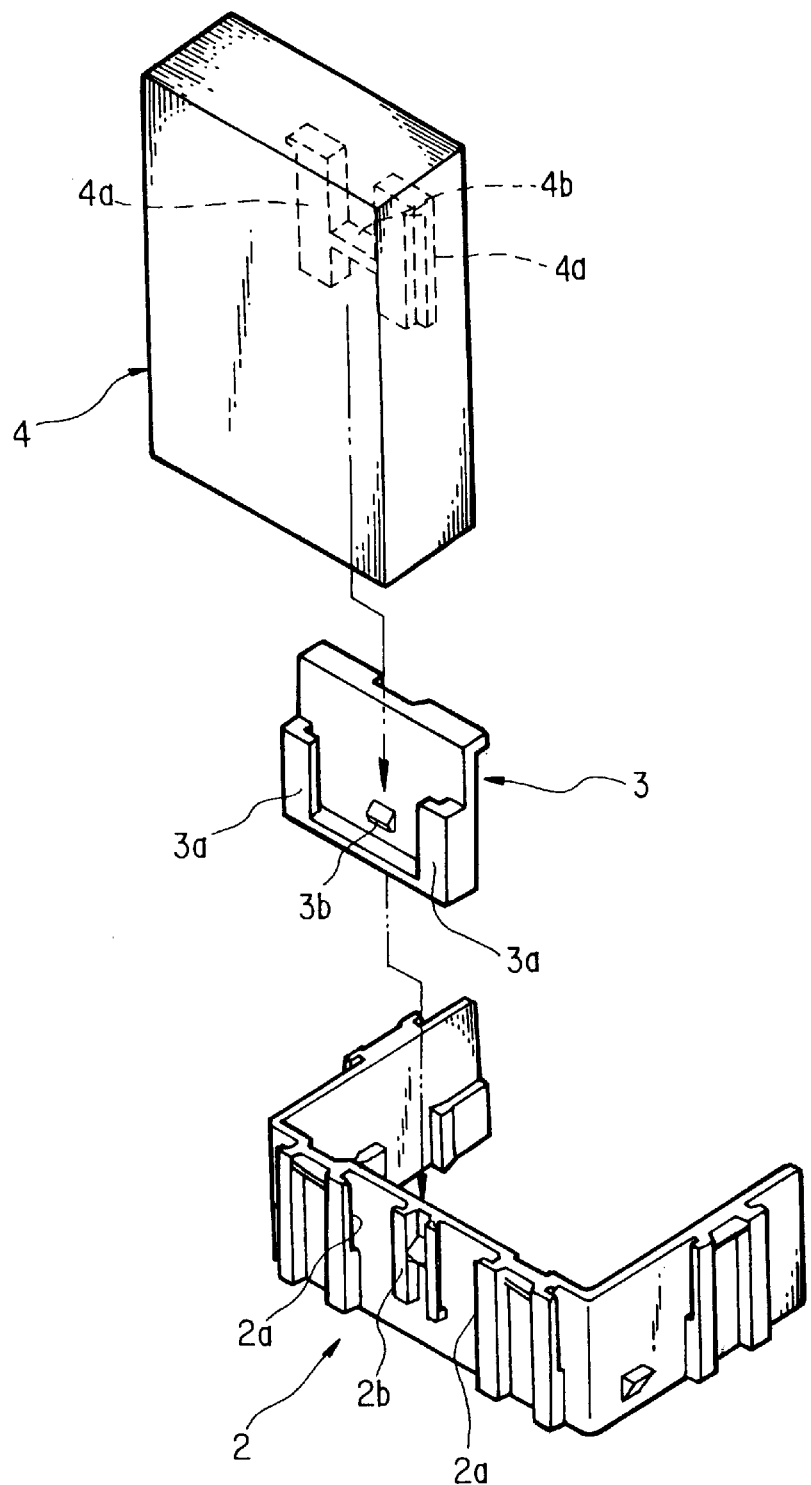
FIG. 6 is an exploded, perspective view of the other related box-shaped electric part-mounting construction.

A preferred embodiment of a box-shaped electric part-mounting construction of the present invention will now be described in detail with reference to FIGS. 1 to 4B. FIG. 1 is an exploded, perspective view showing the construction of mounting a connector (box-shaped electric part), FIGS. 2A and 2B are cross-sectional views showing a connected condition of this construction, FIG. 3 is an exploded, perspective view showing the construction of mounting another connector (box-shaped electric part), and FIGS. 4A and 4B are cross-sectional views showing a connected condition of this construction.

A connector block 10 has a box-shape with an open top, and ribs 13 are formed respectively at a plurality of portions of this connector block 10. The rib 13 may be a side wall or a peripheral wall of the connector block 10, or may be a rib formed within the connector block 10. As shown in FIGS. 1 and 3, a notch 14 is formed in each of the ribs 13. The notch 14 has an upwardly-open, U-shaped configuration (that is, U-shaped contour), and a groove (elongate recess) 15 is formed in the edge of the notch 14 over an entire length thereof, this edge being defined by opposite side surfaces 14a and a bottom surface 14b which jointly define the U-shaped contour of the notch 14. A recess 16 is formed in a lower portion of that portion of the groove 15 formed in each of the opposite side surfaces 14a.

An attachment 20 is fitted and retained in this notch 14. The attachment 20 has the same shape as that of the notch 14, and has a thickness equal to the thickness of the rib 13. A ridge (elongate projection) 22, corresponding to the groove 15 in the connector block 10, is formed on an edge 21 of the attachment 20 defined by opposite side surfaces 21a and a bottom surface 21b. A projection 23, corresponding to the recess 16, is formed on a lower portion of that portion of the ridge 22 formed on each of the opposite side surfaces 21a. Engagement portions 24 and 25 for engagement respectively with different kinds of connectors are formed respectively on opposite sides (faces) of the attachment 20. In the illustrated embodiment, the engagement portion 24 includes flanges 24a extending respectively from opposite side edges thereof, and an upwardly-extending tongue 24b provided at a central portion thereof, as shown in FIG. 1. A lock projection 24c is formed on an inner surface of the tongue 24b at a distal end portion thereof. As shown in FIG. 3, the other engagement portion 25 has two holding piece portions 25a of an L-shaped cross-section disposed in opposed relation to each other.

Two different kinds of connectors 30a and 30b are engaged respectively with the engagement portions 24 and 25 formed respectively on the opposite sides of the attachment 20. As shown in FIG. 1, an engagement portion 31 of the connector 30a, adapted to be engaged with the engagement portion 24, has a cavity portion 31a which is open to its outer side and lower side. Grooves 31b for respectively fitting on the flanges 24a of the engagement portion 24 of the attachment 20 are formed respectively in opposite side walls of the cavity portion 31a, and a downwardly-extending tongue 31c is formed on a lower portion of a central wall of the cavity portion 31a. A recess 31d for engagement with the lock projection 24c of the attachment 20 is formed on an inner surface of the tongue 31c at a lower end portion thereof. As shown in FIG. 3, an engagement portion 32 of the connector 30b, adapted to be engaged with the other engagement portion 25, has a cavity portion 32a which is open to its outer side and lower side. A tongue 32b extends downwardly from the top of the cavity portion 32a, and a claw 32c is formed on an inner surface of the tongue 32b at a lower end thereof.

The connectors 30a and 30b are retained on the connector block 10 of this construction through the attachment 20 in the following manner. Namely, as shown in FIG. 1, the attachment 20, having the engagement portion 24 corresponding to the connector 30a to be attached, is inserted into the notch 14 in the rib 13 of the connector block 10, with the ridge 22 fitted in the groove 15 in the connector block 10. As a result, the attachment 20, while guided by the groove 15 in the connector bock 10, moves into the notch 14, and the projections 23 of the attachment 20 are fitted respectively in the recesses 16 in the connector block 10, so that the attachment 20 is retained on the connector block 10. Then, the engagement portion 31 of the connector 30a is connected to the engagement portion 24 of the attachment 20 from the upper side. As a result, the grooves 31b in the connector 30a are fitted respectively on the flanges 24a of the attachment 20 as shown in FIG. 2A, and when the connector 30a is further pressed down, the recess 31d in the tongue 31c of the connector 30a is engaged with the lock projection 24c of the tongue 24b as shown in FIG. 2B, so that the connector 30a is retained relative to the attachment 20.

As shown in FIG. 3, when the other connector 30b is to be attached to the connector block 10, using the other engagement portion 25 of the attachment 20, the attachment 20 is reversed or turned inside out, and the attachment 20 is inserted into the notch 14, with the ridge 22 fitted in the groove 15 in the connector block 10. As a result, the attachment 20, while guided by the groove 15 in the connector bock 10, moves into the notch 14, and the projections 23 of the attachment 20 are fitted respectively in the recesses 16 in the connector block 10, so that the attachment 20 is retained on the connector block 10. Then, the engagement portion 32 of the connector 30b is connected to the engagement portion 25 of the attachment 20 from the upper side. As a result, the tongue 32b of the connector 30b is fitted into the holding piece portions 25a of the attachment 20 as shown in FIG. 4A, and when the connector 30b is further pressed down, the claw 32c on the tongue 32b is engaged with the lower surfaces of the holding piece portions 25a as shown in FIG. 4B, so that the connector 30b is retained relative to the attachment 20.

In the above embodiment, the engagement portions 24 and 25, formed respectively on the opposite sides of the attachment 20, are shown merely by way of example, and other engagement portions of various shapes can be formed in accordance with the engagement portions of the connectors to be attached. In the above embodiment, although the connector 30a or the connector 30b is retained on the connector block, using one side of the attachment 20, that is, using the engagement portion 24 or the engagement portion 25, the two connectors 30a and 30b can be engaged with the connector block 10 at the same time, using the opposite sides of the attachment 20. In the above embodiment, although the connectors 30a and 30b are engaged with the connector block 10, other box-shaped electric parts than the connectors, such for example as fuse boxes, can be attached using this mounting construction.

As described above, in the present invention, the upwardly-open notch is formed in the rib formed in an upstanding manner on the block, and the attachment is reversibly fitted and held in the notch, and the engagement portions of different shapes for respectively holding two different box-shaped electric parts are formed respectively on the opposite sides of the attachment, and the different box-shaped electric parts can be mounted on the block through the attachment. Therefore, when the different box-shaped electric part is to be engaged with the block, the box-shaped electric part-mounting surfaces of the attachment are reversed, and the different box-shaped electric part is engaged with this engagement portion. Therefore, the two kinds of box-shaped electric parts can be mounted through one attachment, and the number of the attachments can be reduced, and therefore the cost is reduced, and also a stock management is easy.

The notch, formed in the rib of the block has a U-shaped contour. With this construction, if the attachment is mounted upside down in the notch, the attachment can not be completely inserted into the notch. Therefore, this erroneous mounting can be easily detected.

One of the groove and the ridge is formed at the edge of the notch in the rib, and the other of the groove and the ridge for fitting engagement with the one of the groove and the ridge is formed at the edge of the attachment, and the attachment is reversibly fitted and held in the notch. With this construction, when inserting the attachment into the notch in the rib, the attachment is guided by the groove or the ridge provided at the rib, and therefore the attachment can be easily mounted in the notch.

One of the recess and the projection is formed at that surface of the rib defining the notch, and the other of the recess and the projection is formed at the edge of the attachment, and when the attachment is reversibly fitted and held in the notch, the one of the recess and the projection, provided at the rib, is fitted relative to the other of the recess and the projection provided at the attachment, thereby retaining the attachment relative to the rib. With this construction, the attachment will not be disengaged from the block, and will be positively retained on the block.

What is claimed is:

1. A mounting construction, comprising:
   a block attachable to a mounting portion;
   a rib formed on the block;
   a notch formed in the rib;
   an attachment having a first surface and a second surface opposite to the first surface, the attachment reversibly fittable in the notch;
   a first engagement portion, to which a first box-shaped electric part is attachable, formed on the first surface of the attachment; and
   a second engagement portion, to which a second box-shaped electric part is attachable, formed on the second surface of the attachment, a shape of the second engagement portion being different from the first engagement portion.

2. The mounting construction of claim 1, wherein the attachment is fittable in the notch reversibly with respect to the first and second surfaces.

3. The mounting construction of claim 1, wherein the rib is formed on the block in an upstanding manner.

4. The mounting construction of claim 1, wherein the notch is formed in the rib to open upwardly.

5. The mounting construction of claim 1, wherein the notch has a U-shaped contour.

6. The mounting construction of claim 5, further comprising:
   a groove; and
   a ridge engageable with the groove,
   wherein one of the groove and the ridge is formed at that surface of the rib defining the notch while another of the groove and the ridge is formed at an edge of the attachment, and
   wherein, when the attachment is fitted in the notch, the groove engages with the ridge.

7. The mounting construction of claim 6, further comprising:
   a recess; and
   a projection,
   wherein one of the recess and the projection is formed at the groove while another of the recess and the projection is formed at the ridge,
   wherein, when the attachment is fitted in the notch, the recess engages with the projection.

8. The mounting construction of claim 1, further comprising:
   a recess; and
   a projection,
   wherein one of the recess and the projection is formed at that surface of the rib defining the notch while another of the recess and the projection is formed at an edge of the attachment,
   wherein, when the attachment is fitted in the notch, the recess engages with the projection so that the attachment is retained relative to the rib.

9. The mounting construction of claim 1, further comprising:
   a groove; and
   a ridge engageable with the groove,
   wherein one of the groove and the ridge is formed at that surface of the rib defining the notch while another of the groove and the ridge is formed at an edge of the attachment, and
   wherein, when the attachment is fitted in the notch, the groove engages with the ridge.

10. The mounting construction of claim 7, further comprising:
    a recess; and
    a projection,
    wherein one of the recess and the projection is formed at the groove while another of the recess and the projection is formed at the ridge,
    wherein, when the attachment is fitted in the notch, the recess engages with the projection.

* * * * *